United States Patent
Nakaie et al.

(10) Patent No.: US 10,355,249 B2
(45) Date of Patent: Jul. 16, 2019

(54) ORGANIC ELECTRO-LUMINESCENCE DISPLAY DEVICE AND MANUFACTURING METHOD OF AN ORGANIC ELECTRO-LUMINESCENCE DISPLAY DEVICE

(71) Applicant: Japan Display Inc., Minato-ku (JP)

(72) Inventors: Hiroki Nakaie, Minato-ku (JP); Toshihiko Itoga, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/943,905

(22) Filed: Apr. 3, 2018

(65) Prior Publication Data

US 2018/0294445 A1 Oct. 11, 2018

(30) Foreign Application Priority Data

Apr. 11, 2017 (JP) ................................. 2017-078371

(51) Int. Cl.
- *H01L 51/56* (2006.01)
- *H01L 51/52* (2006.01)
- *H01L 51/00* (2006.01)

(52) U.S. Cl.
CPC .......... *H01L 51/56* (2013.01); *H01L 51/0002* (2013.01); *H01L 51/003* (2013.01); *H01L 51/0024* (2013.01); *H01L 51/0097* (2013.01); *H01L 51/5253* (2013.01); *H01L 2251/5338* (2013.01)

(58) Field of Classification Search
CPC ... H01L 51/56; H01L 51/0024; H01L 51/003; H01L 51/0097; H01L 51/5253; H01L 51/0002; H01L 2251/5338
See application file for complete search history.

(56) References Cited

U.S. PATENT DOCUMENTS

| 6,278,131 B1 * | 8/2001 | Yamazaki | ........... H01L 27/1237 257/347 |
| 2015/0364721 A1 * | 12/2015 | Kuriyagawa | ......... H01L 27/322 257/88 |

FOREIGN PATENT DOCUMENTS

| JP | 2005-099410 | 4/2005 |
| JP | 2015-127124 | 7/2015 |

* cited by examiner

*Primary Examiner* — Karen Kusumakar
(74) *Attorney, Agent, or Firm* — Oblon, McClelland, Maier & Neustadt, L.L.P.

(57) ABSTRACT

A manufacturing method of an organic EL display device according to an embodiment of the present invention includes: disposing a first organic substrate having flexibility on a glass substrate; disposing a barrier layer on the first organic substrate; disposing a second organic substrate having flexibility on the barrier layer such that a thickness of a terminal section area is thinner than a thickness of a pixel section area, or at least a part of the terminal section area is not covered; disposing a pixel control section on the terminal section area of the second organic substrate and a pixel generating section on the pixel section area, respectively; disposing a circuit section at least on the terminal section area, the circuit section having a thin film transistor, wherein the circuit section is formed directly on the second organic substrate.

6 Claims, 7 Drawing Sheets

ORGANIC ELECTRO-LUMINESCENCE DISPLAY DEVICE AND MANUFACTURING METHOD OF AN ORGANIC ELECTRO-LUMINESCENCE DISPLAY DEVICE

CROSS-REFERENCE TO RELATED APPLICATION

The present application claims priority from Japanese application JP2017-78371 filed on Apr. 11, 2017, the content of which is hereby incorporated by reference into this application.

BACKGROUND OF THE INVENTION

1. Field of the Invention

The present invention relates to a method for manufacturing an organic EL display device and an organic EL display device.

2. Description of the Related Art

Conventionally, an organic substrate has been used for a TFT substrate of an organic EL display device, thereby providing flexibility (see e.g., JP2005-099410A).

SUMMARY OF THE INVENTION

In the conventional production process, a pixel control terminal section and a pixel generating section are disposed, and then an organic substrate in the terminal section area is etched from its backside (see e.g., JP2015-127124A). This is because thinning the substrate provides more flexibility, although etching process generates dusts. Since the pixel control terminal section and the pixel generating section are already disposed, cleaning the substrate is not possible and thus the dusts cannot be removed completely. As such, the dusts remain in the pixel control terminal section and the pixel generating section, which may generate a defective organic EL display device.

Another method to be considered is etching the organic substrate in the terminal section area from the surface side before the pixel control section and the pixel generating section are disposed. The inventors of the present invention believed, however, that there was a problem as follows. The thin film transistor (TFT) substrate provided on the glass substrate is removed from the backside by using laser beams to eventually alter the quality of the part where the glass substrate is in contact with the organic substrate. However, the thickness of the organic substrate that is enough to be altered by laser beams is difficult to be ensured in the terminal section area, and thus it is difficult to perform etching process satisfactorily.

One or more embodiments of the present invention have been conceived in view of the above, and an object thereof is to provide a manufacturing method of an organic EL display device and an organic EL display device suitable for the method that suppresses effects of dust generated due to etching on an organic substrate in a terminal section area and enables the organic substrate to be easily removed from the glass substrate.

A manufacturing method of an organic EL display device according to an embodiment of the present invention includes: disposing a first organic substrate having flexibility on a glass substrate; disposing a barrier layer on the first organic substrate; disposing a second organic substrate having flexibility on the barrier layer such that a thickness of a terminal section area is thinner than a thickness of a pixel section area, or at least a part of the terminal section area is not covered; disposing a pixel control section on the terminal section area of the second organic substrate and a pixel generating section on the pixel section area, respectively; disposing a circuit section at least on the terminal section area, the circuit section having a thin film transistor, wherein the circuit section is formed directly on the second organic substrate.

In one embodiment of the present invention, a thickness of the second organic substrate is equal to or less than a thickness of the first organic substrate.

In one embodiment of the present invention, the step of disposing the second organic substrate includes: scrapping an organic substrate such that the thickness of the terminal section area is thinner than the thickness of the pixel section area or at least a part of the terminal section area is not covered, the organic substrate being formed to have an even thickness; and cleaning the organic substrate.

In one embodiment of the present invention, the step of disposing the second organic substrate includes changing a discharge amount or a moving speed of a device that discharges a material of the second organic substrate such that the thickness of the terminal section area is thinner than the thickness of the pixel section area, or at least a part of the terminal section area is not covered.

An organic EL display device according to an embodiment of the present invention includes: a first organic substrate having flexibility; a barrier layer on the first organic substrate; a second organic substrate having flexibility disposed on the barrier layer such that a thickness of a terminal section area is thinner than a thickness of a pixel section area, or at least apart of the terminal section area is not covered; a pixel control section on the terminal section area of the second organic substrate; a pixel generating section on the pixel section area of the second organic substrate; a circuit section disposed at least on the terminal section area, the circuit section having a thin film transistor, wherein the circuit section is formed directly on the second organic substrate.

In one embodiment of the present invention, a thickness of the second organic substrate is equal to or less than a thickness of the first organic substrate.

DETAILED DESCRIPTION OF THE INVENTION

Embodiments of the present invention will be described below in detail with reference to the accompanying drawings. The disclosure herein is merely an example, and appropriate modifications coming within the spirit of the present invention, which are easily conceived by those skilled in the art, are intended to be included within the scope of the invention as a matter of course. The accompanying drawings schematically illustrate widths, thicknesses, shapes, or other characteristics of each part for clarity of illustration, compared to actual configurations. However, such a schematic illustration is merely an example and not intended to limit the present invention. In the present specification and drawings, some elements identical or similar to those shown previously are denoted by the same reference signs as the previously shown elements, and thus repetitive detailed descriptions of them may be omitted as appropriate.

Figure 1:
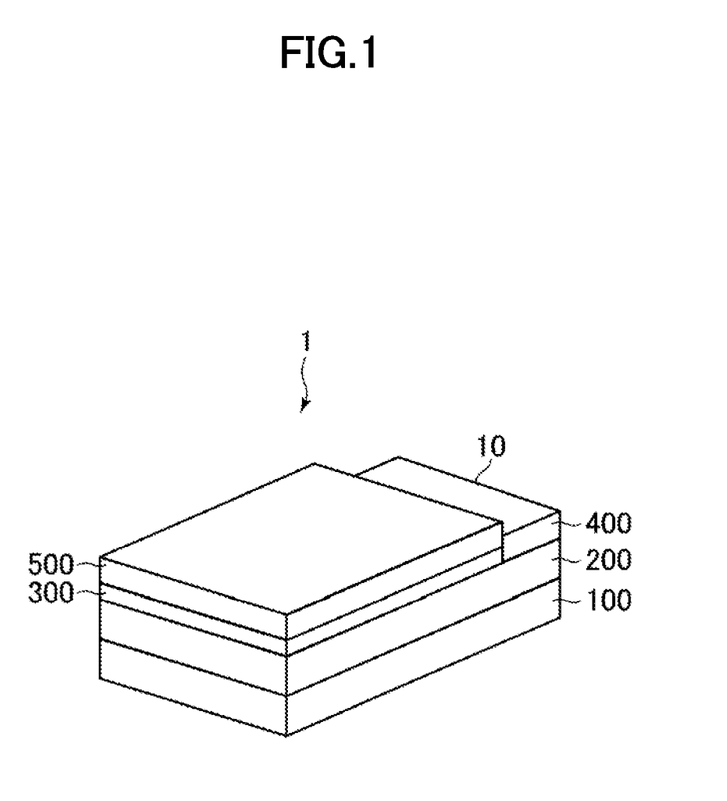
FIG. 1 is a perspective view of a laminate structure of a display panel according to first and second embodiments.
Figure 2:
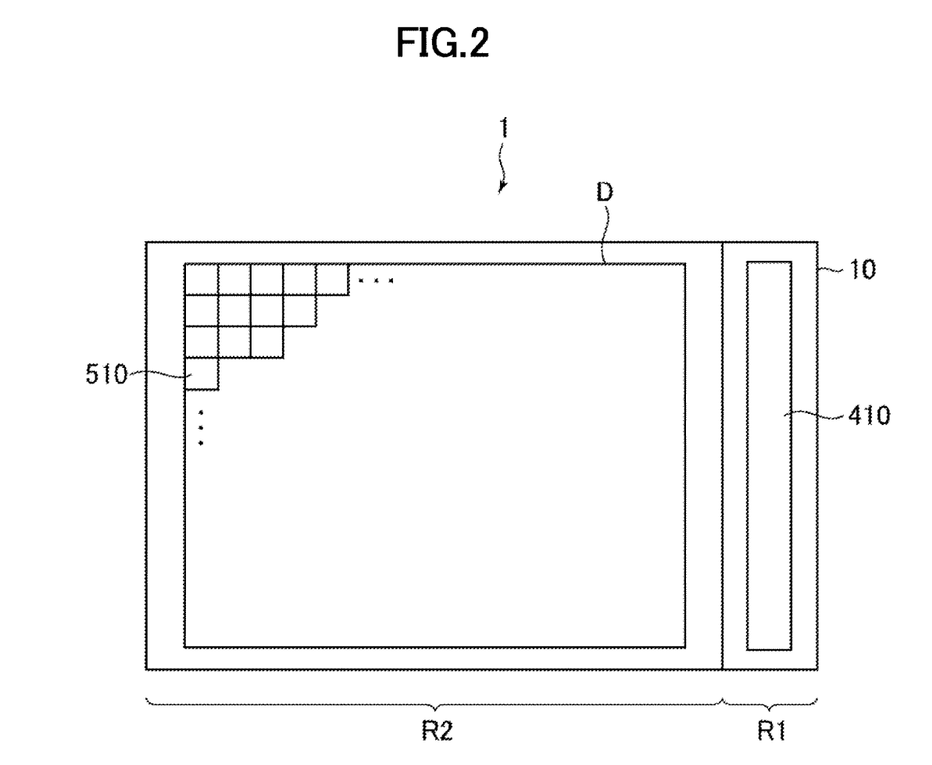
FIG. 2 is a plan view of a circuit configuration of the display panel according to the first and second embodiments.

First, referring to FIGS. 1 and 2, a display panel 1 constituting an organic EL display device according to the present invention will be described. FIG. 1 is a perspective view showing a laminate structure of the display panel 1 according to first and second embodiments. FIG. 2 is a plan view showing a circuit configuration of the display panel 1 according to first and second embodiments. The display panel 1 includes a TFT substrate 10. From the bottom, a first organic substrate 100 and a barrier layer 200 are disposed in order, and a second organic substrate 300 is disposed on the barrier layer 200. In this regard, the second organic substrate 300 is disposed such that the thickness of the terminal section area R1 is thinner than the thickness of a pixel section area R2, or the second organic substrate 300 does not cover at least a part of the terminal section area R1. A pixel control section 400 and a pixel generating section 500 are respectively disposed on the terminal section area R1 and the pixel section area, and the laminate structure of the TFT substrate 10 are thereby formed.

The TFT substrate 10 includes pixels 510 formed in a matrix on a display area D in the pixel generating section 500, and a drive IC (Integrated Circuit) 410 for transistors respectively disposed in the pixels. Specifically, for example, the drive IC 410 applies, to scan signal lines of transistors respectively disposed in sub-pixels forming the pixels 510, a potential for electrically connecting sources and drains. The drive IC 410 also applies, to data signal lines of the respective transistors, voltage corresponding to gradation values of the pixels 510.

The first organic substrate 100 and the second organic substrate 300 are flexible and bendable insulating substrates. The materials of these organic substrates may be any organic substance having flexibility and insulation property, such as solvent-soluble polyimide.

The barrier layer 200 is a protective film that protects electrodes and organic materials forming an organic light-emitting film from moisture ingress, and made of, for example, Si oxides and nitrides, or metal oxides such as Al and Zn.

The pixel control section 400 includes pixel control terminals, and is provided at one end of the TFT substrate 10. For example, a scan signal drive circuit for controlling scan signal lines and a data signal drive circuit for controlling data signal lines are formed as the drive IC 410.

The pixel generating section 500 includes scan signal lines and data signal drive lines formed in a matrix. The parts surrounded by the scan signal lines and the data signal drive lines form the pixels 510.

The terminal section area R1 indicates an area in which the pixel control section 400 is disposed, and the pixel section area R2 indicates an area in which the pixel generating section 500 is disposed. In other words, the terminal section area R1 is an area at one end of the TFT substrate 10, and the pixel section area R2 is an area other than the terminal section area R1.

First Embodiment

Figure 3:
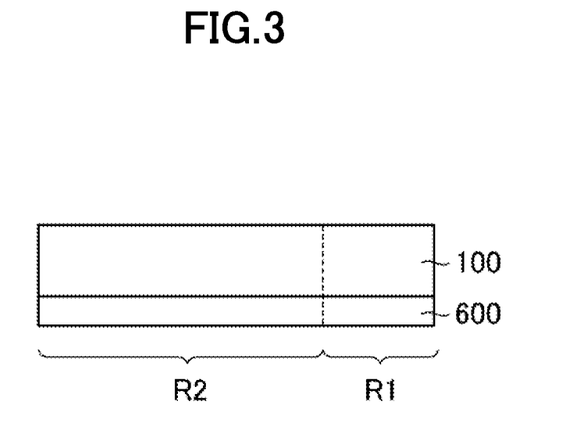
FIG. 3 is a diagram illustrating a process of disposing a first organic substrate on a glass substrate according to the first and second embodiments.

Referring to FIGS. 3 to 8, a manufacturing method of the display panel 1 according to the first embodiment will be described. FIG. 3 is a diagram illustrating a process of disposing the first organic substrate 100 on the glass substrate 600 according to first and second embodiments. The organic substrate is formed using a coating device so as to be of even thickness after being dried. The coating device is set to discharge a fixed amount of liquid to be a material of the organic substrate while maintaining constant moving speed from the pixel section area R2 to the terminal section area R1. In this process as well, the first organic substrate 100 is disposed on the glass substrate 600 so as to be of even thickness.

Figure 4:
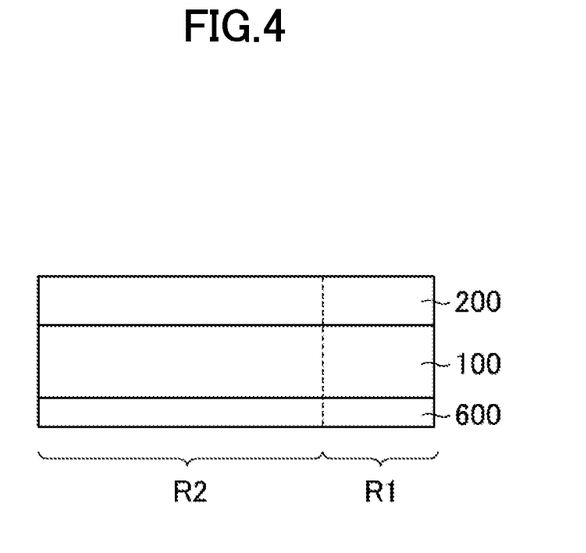
FIG. 4 is a diagram illustrating a process of disposing a barrier layer on the upper surface of the first organic substrate according to the first and second embodiments.

FIG. 4 is a diagram illustrating a process of disposing a barrier layer 200 on the upper surface of the first organic substrate 100 according to the first and second embodiments. The coating device also discharges a material of the barrier layer 200 in the same way as disposing the first organic substrate 100. The barrier layer 200 is then formed using processing by the vapor phase method. This enables to dispose the barrier layer 200 on the first organic substrate 100 such that the barrier layer 200 is of even thickness.

Figure 5:
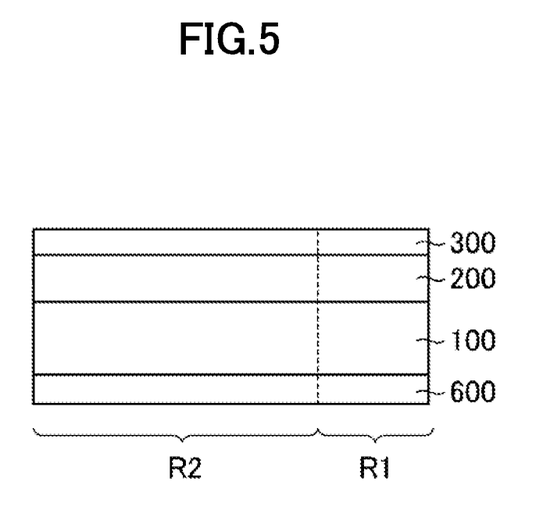
FIG. 5 is a diagram illustrating a process of disposing a second organic substrate on the upper surface of the barrier layer in the first embodiment.

FIG. 5 is a diagram illustrating a process of disposing the second organic substrate 300 on the upper surface of the barrier layer 200 in the first embodiment. In this process as well, similarly to the first organic substrate 100, the second organic substrate 300 is disposed on the barrier layer 200 so as to be of even thickness. At this time, the second organic substrate 300 is provided so as to have a thickness equal to or less than the thickness of the first organic substrate 100.

Figure 6:
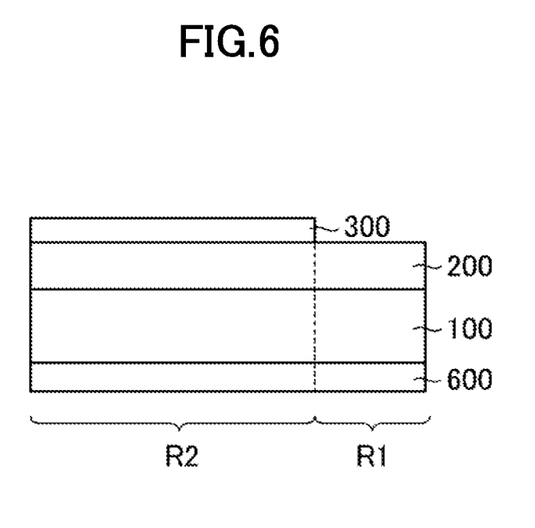
FIG. 6 is a diagram illustrating a process of etching the second organic substrate in the terminal section area in the first embodiment.

FIG. 6 is a diagram illustrating a process of etching the second organic substrate 300 in the terminal section area R1 in the first embodiment. As shown in FIG. 6, by etching the second organic substrate 300 disposed in the terminal section area R1, the second organic substrate 300 in the terminal section area R1 is removed and the barrier layer 200 is exposed on the surface side. Alternatively, the second organic substrate 300 may not be completely removed in the terminal section area R1, but may be etched so that the second organic substrate 300 is thinner in the terminal section area R1 than in the pixel section area R2. At this time, the second organic substrate 300 may be completely removed in a part of the terminal section area R1. After the etching process, the surface layer of the terminal section area R1 and the pixel section area R2 are cleaned with pure water, for example, and dusts due to the etching can be thereby removed completely.

Figure 7:
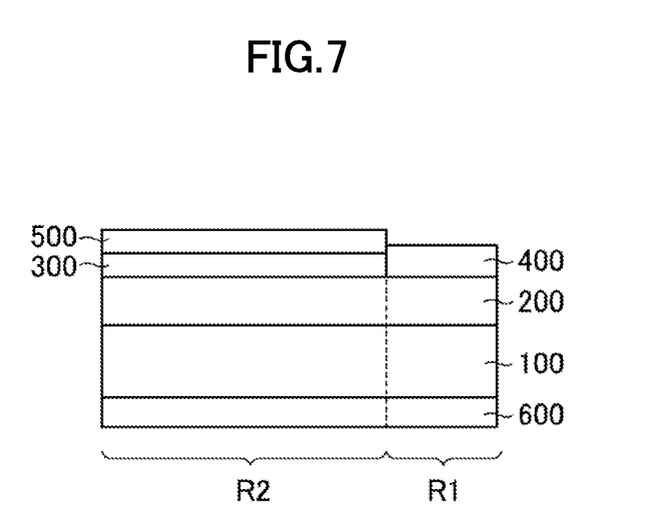
FIG. 7 is a diagram illustrating a process of, after the etching process, disposing a pixel control section on the surface side of the terminal section area, and disposing a pixel generating section on the upper surface side of the second organic substrate in the pixel section area.

FIG. 7 is a diagram illustrating a process of, after the etching process, disposing the pixel control section 400 on the surface side of the terminal section area R1, and disposing the pixel generating section 500 on the upper surface side of the second organic substrate 300 in the pixel section area R2. After the cleaning process, the pixel control section 400 and the pixel generating section 500 are disposed respectively on the surface side of the terminal section area R1 and the surface side of the pixel section area R2 of the completely dried substrate. Subsequently, a circuit section (including scan signal lines and data signal drive lines) having the TFT is disposed at least on the terminal section area R1, and the desired TFT substrate 10 as shown in FIGS. 1 and 2 is thus completed.

Depending on the state of etching, the surface side of the terminal section area R1 may be one of three conditions: a condition in which the entire barrier layer 200 is exposed; a condition in which the thinned second organic substrate 300 is disposed and the barrier layer 200 is partially exposed; and a condition in which the thinned second organic substrate 300 is disposed on the entire area. In any condition, the pixel control section 400 is disposed in the surface layer.

Figure 8:
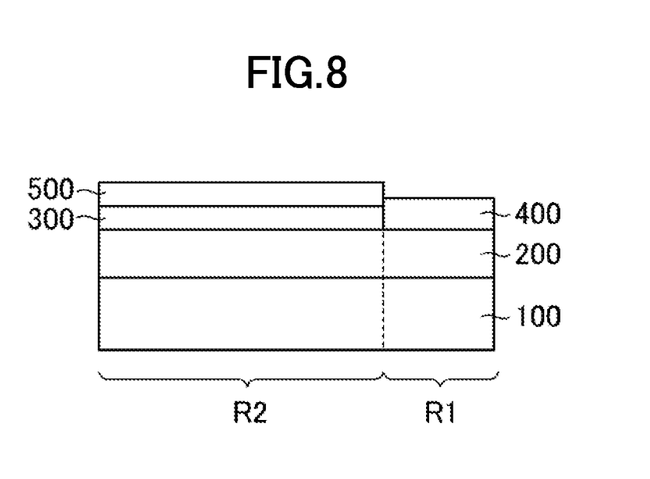
FIG. 8 is a diagram illustrating a process of separating the glass substrate from the first organic substrate in the first embodiment.

FIG. 8 is a diagram illustrating a process of separating the glass substrate 600 from the first organic substrate 100 in the first embodiment. The laser beams are used to alter the part where the glass substrate 600 is in contact with the first organic substrate 100, and then the TFT substrate 10 is removed from the backside.

By the above described manufacturing method of the organic EL display device according to the first embodiment, the second organic substrate 300 in the terminal section area R1 is etched and cleaned before the pixel control section 400 and the pixel generating section 500 are disposed, and thus the desired film thickness profile can be formed. This can provide a manufacturing method of an organic EL display device that suppresses effects of dusts generated due to etching an organic substrate in a terminal section area and enables the organic substrate to be easily removed from the glass substrate 600, and an organic EL display device suitable for the method.

As indicated by the manufacturing method of the organic EL display device according to the first embodiment, a moving speed and a material discharge amount of the coating device is kept constant when the coating device forms an organic substrate while moving from the pixel section area R2 to the terminal section area R1. With this method, the organic substrate can be formed in an even thickness. In addition, the second organic substrate 300 in the terminal section area R1 is thinned by etching and then cleaned to eliminate dusts due to the etching. However, etching is not the only method for thinning the second organic substrate 300 in the terminal section area R1 in order to obtain the desired effect of the present invention.

Second Embodiment

Next, referring to FIGS. 3, 4, and 9 to 11, a method for manufacturing the display panel 1 according to the second embodiment will be described. In the second embodiment as well, as shown in FIGS. 3 and 4, the first organic substrate 100 and the barrier layer 200 are disposed on the glass substrate 600. As such, the process of providing the first organic substrate 100 on the glass substrate 600 and the process of providing the barrier layer 200 on the first organic substrate 100 are the same as described in the first embodiment, and thus will be omitted here.

Figure 9:
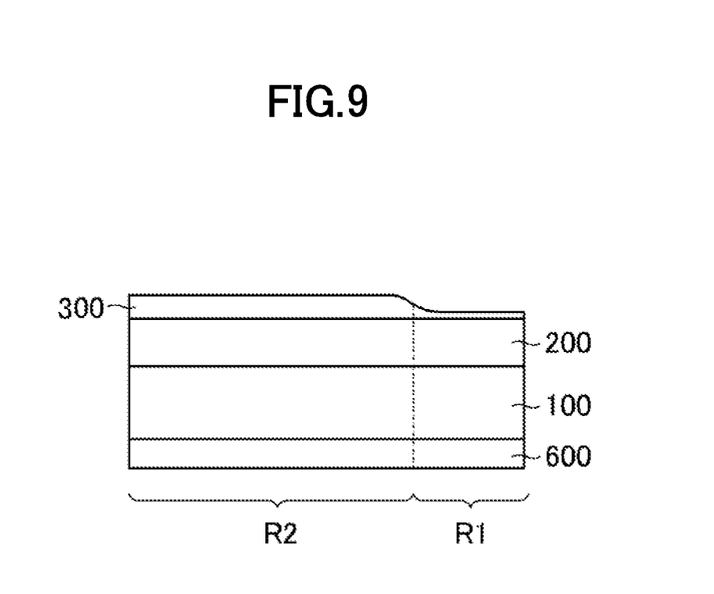
FIG. 9 is a diagram illustrating a process of forming a second organic substrate on the upper surface of the barrier layer in the second embodiment.

FIG. 9 is a diagram illustrating a process of forming a second organic substrate 300 on the upper surface of the barrier layer 200 in the second embodiment. The second organic substrate 300 in this process is also formed by the coating device as described above. While keeping constant moving speed, the coating device reduces a discharge amount of liquid material for forming the second organic substrate 300 ahead of the boundary to enter the terminal section area R1 from the pixel section area R2. Subsequently, the coating device discharges the reduced and fixed amount of liquid material in the terminal section area R1, thereby forming the second organic substrate 300 such that a thickness of the second organic substrate 300 in the terminal section area R1 is thinner than a thickness of the second organic substrate 300 in the pixel section area R2.

Alternatively, the coating device may not discharge liquid material for forming the second organic substrate 300 in the terminal section area R1 so that the entire barrier layer 200 is exposed in the surface side of the terminal section area R1, or the thinned second organic substrate 300 is disposed on the surface side of the terminal section area R1 and the barrier layer 200 is partially exposed.

A method other than the method for reducing the discharge amount of liquid material for forming the second organic substrate 300 may be employed. While keeping the constant discharge amount of liquid material for forming the second organic substrate 300, the moving speed of the coating device may be increased ahead of the boundary to enter the terminal section area R1 from the pixel section area R2. Subsequently, the coating device maintains the increased and fixed speed in the terminal section area R1, thereby forming the second organic substrate 300 such that a thickness of the second organic substrate 300 in the terminal section area R1 is thinner than a thickness of the second organic substrate 300 in the pixel section area R2.

Figure 10:
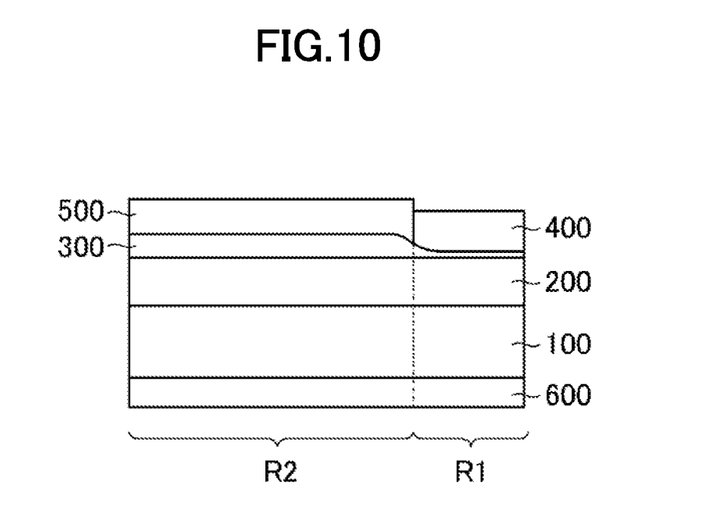
FIG. 10 is a diagram illustrating a process of disposing a pixel control section on the second organic substrate in the terminal section area, and disposing a pixel generating section on the second organic substrate in the pixel section area in the second embodiment.
Figure 11:
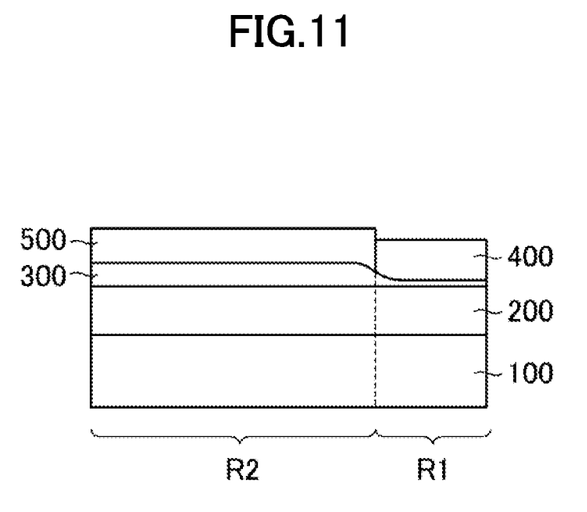
FIG. 11 is a diagram illustrating a process of removing the glass substrate from the first organic substrate in the second embodiment.

FIG. 10 is a diagram illustrating a process of disposing a pixel control section 400 on the second organic substrate 300 in the terminal section area R1, and disposing a pixel generating section 500 on the second organic substrate 300 in the pixel section area R2 in the second embodiment. FIG. 11 is a diagram illustrating a process of removing the glass substrate 600 from the first organic substrate 100 in the second embodiment. These two processes and the process of disposing a circuit section (including scan signal lines and data signal drive lines) having the TFT at least on the terminal section area R1 are the same as described in the first embodiment, and thus their descriptions will be omitted.

By the above described manufacturing method of the organic EL display device according to the second embodiment, a discharge amount of liquid material for forming the second organic substrate 300 by the coating device and a moving speed of the coating device can be changed, and thus the desired film thickness profile can be formed without performing the conventional etching process. This can provide a manufacturing method of an organic EL display device that can be easily separated from the glass substrate 600 without considering effects of dusts generated due to etching, and an organic EL display device suitable for the method.

The various modifications and adjustments to the embodiments will be readily apparent to those skilled in the art, and it is to be understood that these modifications and adjustments are included in the scope of the present invention. For example, the addition or deletion of a constituent element, a change in design, the addition or omission of a process, or a change in conditions which is appropriately performed by a person skilled in art with respect to each of the above described embodiments is also included in the scope of the invention when including the gist of the invention.

Furthermore, regarding the above-described embodiment, any additional advantage and effect which are obvious from the description of the specification or appropriately conceived by a skilled person are considered to be naturally achievable by the present invention.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A manufacturing method of an organic EL display device comprising:
   disposing a first organic substrate having flexibility on a glass substrate;
   disposing a barrier layer on the first organic substrate;
   disposing a second organic substrate having flexibility on the barrier layer such that a thickness of a terminal section area is thinner than a thickness of a pixel section area, or at least a part of the terminal section area is not covered;
   disposing a pixel control section on the terminal section area of the second organic substrate and a pixel generating section on the pixel section area, respectively;
   disposing a circuit section at least on the terminal section area, the circuit section having a thin film transistor, wherein
   the circuit section is formed directly on the second organic substrate.

2. The manufacturing method of the organic EL display device according to claim 1, wherein
   a thickness of the second organic substrate is equal to or less than a thickness of the first organic substrate.

3. The manufacturing method of the organic EL display device according to claim 1, wherein
   the step of disposing the second organic substrate includes:
      scrapping an organic substrate such that the thickness of the terminal section area is thinner than the thickness of the pixel section area or at least apart of the terminal section area is not covered, the organic substrate being formed to have an even thickness; and
      cleaning the organic substrate.

4. The manufacturing method of the organic EL display device according to claim 1, wherein
   the step of disposing the second organic substrate includes changing a discharge amount or a moving speed of a device that discharges a material of the second organic substrate such that the thickness of the terminal section area is thinner than the thickness of the pixel section area, or at least a part of the terminal section area is not covered.

5. An organic EL display device comprising:
   a first organic substrate having flexibility;
   a barrier layer on the first organic substrate;
   a second organic substrate having flexibility disposed on the barrier layer such that a thickness of a terminal section area is thinner than a thickness of a pixel section area, or at least a part of the terminal section area is not covered;
   a pixel control section on the terminal section area of the second organic substrate;
   a pixel generating section on the pixel section area of the second organic substrate;
   a circuit section disposed at least on the terminal section area, the circuit section having a thin film transistor, wherein
   the circuit section is formed directly on the second organic substrate.

6. The organic EL display device according to claim 5, wherein
   a thickness of the second organic substrate is equal to or less than a thickness of the first organic substrate.

* * * * *